US012752664B2

(12) United States Patent
Sarwar et al.

(10) Patent No.: US 12,752,664 B2
(45) Date of Patent: Oct. 6, 2026

(54) IDENTIFYING A ROOT CAUSE OF BATTERY CELL DEGRADATION IN A BATTERY PACK

(71) Applicant: GM GLOBAL TECHNOLOGY OPERATIONS LLC, Detroit, MI (US)

(72) Inventors: Azeem Sarwar, Rochester Hills, MI (US); Chaitanya Sankavaram, Rochester Hills, MI (US); Muhammad Aneeq Uz Zaman, Urbana, IL (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 605 days.

(21) Appl. No.: 18/307,669

(22) Filed: Apr. 26, 2023

(65) Prior Publication Data

US 2024/0359591 A1 Oct. 31, 2024

(51) Int. Cl.

*B60L 58/16* (2019.01)
*B60L 58/21* (2019.01)
*G01R 31/367* (2019.01)
*G01R 31/378* (2019.01)
*G01R 31/3835* (2019.01)
*G01R 31/396* (2019.01)

(52) U.S. Cl.

CPC ............... *B60L 58/16* (2019.02); *B60L 58/21* (2019.02); *G01R 31/367* (2019.01); *G01R 31/378* (2019.01); *G01R 31/3835* (2019.01); *G01R 31/396* (2019.01)

(58) Field of Classification Search

CPC ........ B60L 58/16; B60L 58/21; B60L 3/0046; B60L 2240/547; B60L 58/10; G01R 31/367; G01R 31/378; G01R 31/3835; G01R 31/396; G01R 31/392; G01R 31/3648; G01R 31/388; G01R 31/389; Y02E 60/10

See application file for complete search history.

(56) References Cited

U.S. PATENT DOCUMENTS 5,160,880 A * 11/1992 Palanisamy ........ G01R 31/3648 320/DIG. 12
2021/0265674 A1* 8/2021 Doczy .................. G01R 31/392

FOREIGN PATENT DOCUMENTS

WO WO 2015023820 A2 * 2/2015 ............ H01M 10/48

* cited by examiner

*Primary Examiner* — Tung S Lau

(74) *Attorney, Agent, or Firm* — CANTOR COLBURN LLP

(57) ABSTRACT

Embodiments include methods and systems for identifying a root cause of battery cell degradation in a battery pack. Aspects include collecting voltage data for a plurality of battery cells in the battery pack and identifying a first cell of the plurality of battery cells as a defective battery cell. Aspects also include identifying a second cell of the plurality of battery cells as a nominal battery cell and calculating a self-discharge of the defective battery cell based on the voltage data of the defective battery cell and the nominal battery cell. Aspects further include calculating a capacity fade of the defective battery cell based on the voltage data of the defective battery cell and the nominal battery cell and determining the root cause of a defect of the defective battery cell based on the self-discharge and the capacity fade of the defective cell.

20 Claims, 9 Drawing Sheets

IDENTIFYING A ROOT CAUSE OF BATTERY CELL DEGRADATION IN A BATTERY PACK

INTRODUCTION

The disclosure relates to electric vehicles, and more particularly to identifying a root cause of battery cell degradation in a battery pack of an electric vehicle.

Lithium-ion batteries are widely used in electric vehicles due to their high energy density and long cycle life. However, over time, these batteries can experience degradation in the form of capacity fade and self-discharge which can affect their performance.

Capacity fade refers to the gradual decrease in a lithium-ion battery's ability to store and deliver energy over multiple charge and discharge cycles. This phenomenon occurs due to several factors, including the formation of a solid-electrolyte interphase (SEI) layer on the surface of the electrodes, the growth of dendrites on the surface of the anode, and the loss of active lithium ions in the electrolyte. As capacity fade occurs, the battery's overall capacity and runtime gradually decreases, which can affect the device's performance and battery life. The rate of capacity fade can vary depending on several factors, including the operating conditions, the battery chemistry, and the manufacturing quality.

Self-discharge, on the other hand, refers to the natural loss of charge in a battery when it is not in use. Lithium-ion batteries have a relatively low self-discharge rate compared to other battery chemistries, but over time, the self-discharge rate can increase due to several factors, including the battery's age, temperature, and storage conditions. As self-discharge occurs, the battery's available charge decreases, which can affect its performance and lifespan. To mitigate the effects of self-discharge, it is important to store lithium-ion batteries in a cool, dry place with a partial charge (around 40-60% of full capacity) and to recharge them regularly to maintain their capacity.

SUMMARY

In one exemplary embodiment, a method for identifying a root cause of battery cell degradation in a battery pack is provided. The method includes collecting voltage data for a plurality of battery cells in the battery pack, identifying a first cell of the plurality of battery cells as a defective battery cell, and identifying a second cell of the plurality of battery cells as a nominal battery cell. The method also includes calculating a self-discharge of the defective battery cell based on the voltage data of the defective battery cell and the nominal battery cell, calculating a capacity fade of the defective battery cell based on the voltage data of the defective battery cell and the nominal battery cell, and determining the root cause of a defect of the defective battery cell based on the self-discharge and the capacity fade of the defective battery cell.

In addition to the one or more features described herein, the determination of the root cause comprises creating a histogram of a relationship between the self-discharge of the defective battery cell and the capacity fade of the defective battery cell.

In addition to the one or more features described herein, the determination of the root cause further comprises inputting the histogram into a trained predictive model.

In addition to the one or more features described herein, the trained predictive model is a machine learning model that is trained with labeled battery cell failure data.

In addition to the one or more features described herein, the determination of the root cause comprises comparing the histogram to a plurality of histograms associated with known root causes of battery cell degradation.

In addition to the one or more features described herein, the method also includes providing an indication of the defective battery cell and the root cause to a manufacturer of the battery pack.

In addition to the one or more features described herein, the method also includes deactivating the defective battery cell in the battery pack based on the root cause of the battery cell degradation.

In addition to the one or more features described herein, the plurality of battery cells are arranged in a plurality of groups each comprising three of the plurality of battery cells connected in parallel and wherein each of the plurality of groups are connected in series.

In addition to the one or more features described herein, the voltage data is collected before and after each charging event of the battery pack.

In addition to the one or more features described herein, the identification of the first cell as the defective battery cell is based on a determination that a voltage of the first cell is more than a threshold value below an average voltage of the plurality of battery cells.

In addition to the one or more features described herein, the identification of the second cell as the nominal battery cell is based on a determination that a voltage of the second cell is within a threshold value of an average voltage of the plurality of battery cells.

In one exemplary embodiment, an electric vehicle having a battery pack with a plurality of lithium-ion battery cells is provided. The electric vehicle also includes a controller configured to monitor a voltage level of each of the plurality of lithium-ion battery cells. The controller is further configured to collect voltage data for each of a plurality of battery cells in the battery pack, identify a first cell of the plurality of battery cells as a defective battery cell, and identify a second cell of the plurality of battery cells as a nominal battery cell. The controller is further configured to calculate a self-discharge of the defective battery cell based on the voltage data of the defective battery cell and the nominal battery cell, calculate a capacity fade of the defective battery cell based on the voltage data of the defective battery cell and the nominal battery cell, and determine a root cause of a defect of the defective battery cell based on the self-discharge and the capacity fade of the defective battery cell.

In addition to the one or more features described herein, the determination of the root cause comprises creating a histogram of a relationship between the self-discharge of the defective battery cell and the capacity fade of the defective battery cell.

In addition to the one or more features described herein, the determination of the root cause further comprises inputting the histogram into a trained predictive model.

In addition to the one or more features described herein, the trained predictive model is a machine learning model that is trained with labeled battery cell failure data.

In addition to the one or more features described herein, the determination of the root cause comprises comparing the histogram to a plurality of histograms associated with known root causes of battery cell degradation.

In addition to the one or more features described herein, the controller is further configured to provide an indication of the defective battery cell and the root cause to a manufacturer of the battery pack.

In addition to the one or more features described herein, the controller is further configured to deactivate the defective battery cell in the battery pack based on the root cause of the battery cell degradation.

In addition to the one or more features described herein, the plurality of battery cells are arranged in a plurality of groups each comprising three of the plurality of battery cells connected in parallel and wherein each of the plurality of groups are connected in series.

In addition to the one or more features described herein, the voltage data is collected before and after each charging event of the battery pack.

The above features and advantages, and other features and advantages of the disclosure are readily apparent from the following detailed description when taken in connection with the accompanying drawings.

BRIEF DESCRIPTION OF THE DRAWINGS

Other features, advantages, and details appear, by way of example only, in the following detailed description, the detailed description referring to the drawings in which.

DETAILED DESCRIPTION

The following description is merely exemplary in nature and is not intended to limit the present disclosure, its application or uses.

Electric vehicles (EVs) such as battery electric vehicles (BEVs), and hybrid vehicles include one or more electric machines and a battery system. In exemplary embodiments, the battery system includes a battery pack that has a plurality of lithium-ion battery cells that are connected to one another. In general, one or more of the lithium-ion battery cells may fail, or experience a defect, before the remaining cells in the battery pack. Traditionally, in order to determine a cause of a failure of a lithium-ion battery cell, the faulty cell would need to be removed from the battery pack and inspected.

As described above, lithium-ion batteries can experience degradation in the form of capacity fade and self-discharge which can affect their performance. In exemplary embodiments, data regarding the capacity fade and self-discharge experienced by a defective lithium-ion battery cell is collected and analyzed to determine a root cause of a defect of the lithium-ion battery cell. In exemplary embodiments, a machine learning model is trained using labeled capacity fade and self-discharge data collected from battery cells that have known causes of failure. The trained machine learning model is then used to determine the root cause of a defect of a defective lithium-ion battery cell based on the collected capacity fade and self-discharge data of the defective lithium-ion battery cell.

Figure 1:
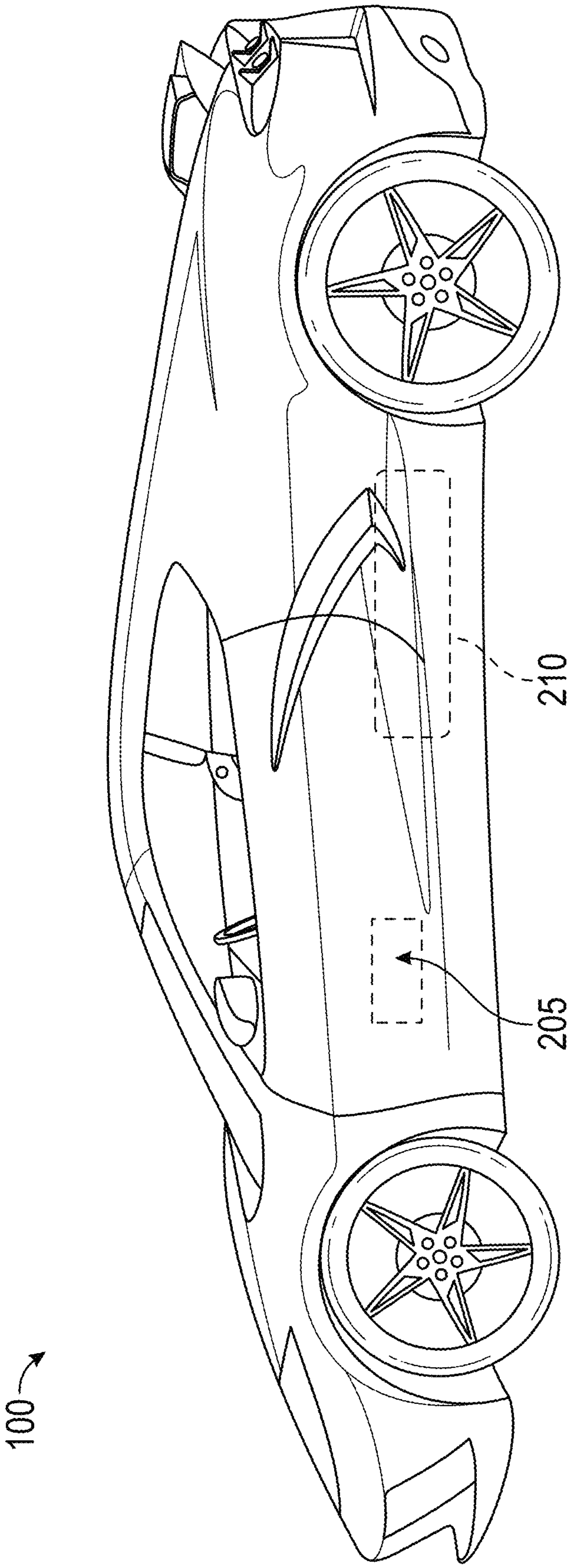
FIG. 1 is a schematic diagram of a vehicle for use in conjunction with one or more embodiments of the present disclosure.

Referring now to FIG. 1, a schematic diagram of a vehicle 100 for use in conjunction with one or more embodiments of the present disclosure is shown. The vehicle 100 includes a controller 205 and a battery pack 210. In one embodiment, the vehicle 100 is a hybrid vehicle that utilizes both an internal combustion engine and an electric motor powered by the switchable battery. In another embodiment, the vehicle 100 is an electric vehicle that only utilizes electric motors that are powered by the battery pack 210. In exemplary embodiments, the controller 205 is a processor that is configured to monitor the battery pack 210. In exemplary embodiments, methods 500 and 700 shown in FIGS. 5 and 7, respectively, are performed by the controller 205 of the electric vehicle 100. In exemplary embodiments, the controller 205 is one of a general-purpose processor, a flexible programmable gate array (FPGA), an application-specific integrated circuit (ASIC), or the like.

Figure 2:
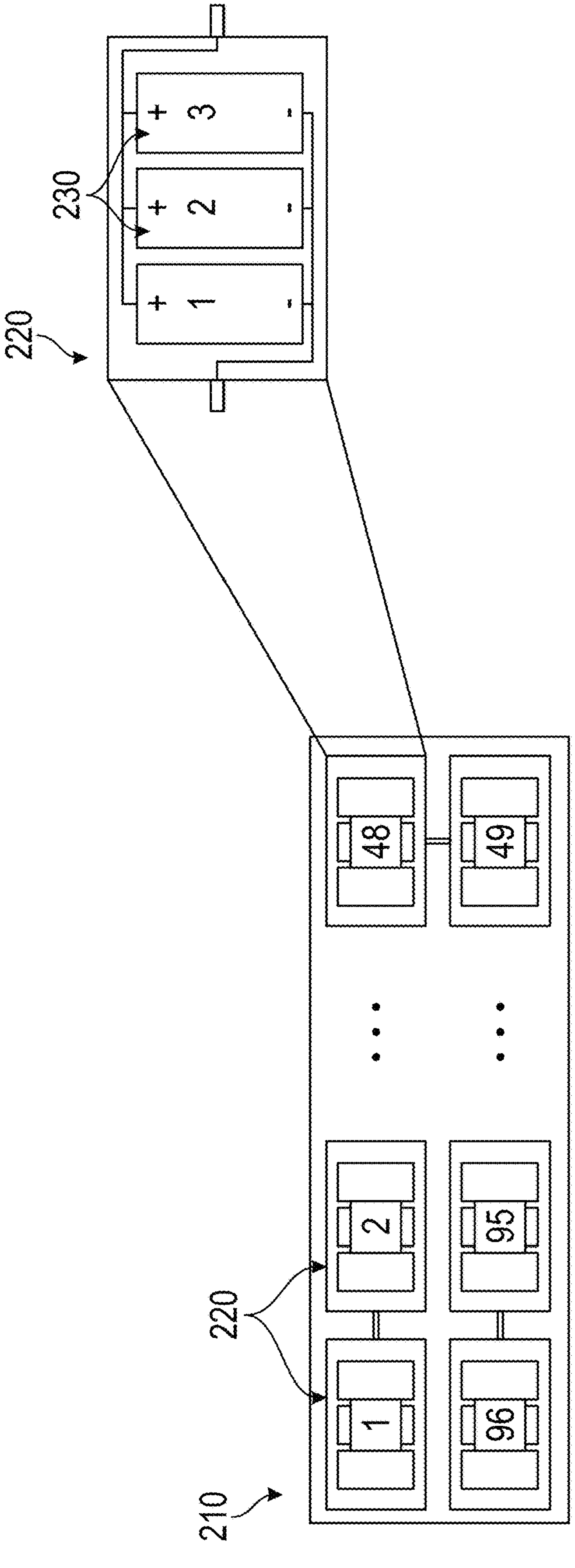
FIG. 2 is a block diagram illustrating a battery pack of a vehicle in accordance with an exemplary embodiment.

Referring now to FIG. 2, a block diagram illustrating a battery pack 210 of a vehicle in accordance with an exemplary embodiment is shown. The battery pack 210 includes a plurality of modules 220 that each include multiple lithium-ion battery cells 230. In one embodiment, each of the lithium-ion battery cells 230 in a cell group 220 are connected in parallel and each of the cell groups 220 are connected in series. In other embodiments, each cell group 220 may contain more or less than three lithium-ion battery cells 230. In exemplary embodiments, the battery pack 210 includes a plurality of sensors (not shown) that are configured to measure one or more of a voltage and temperature of each cell group 220.

Figure 3:
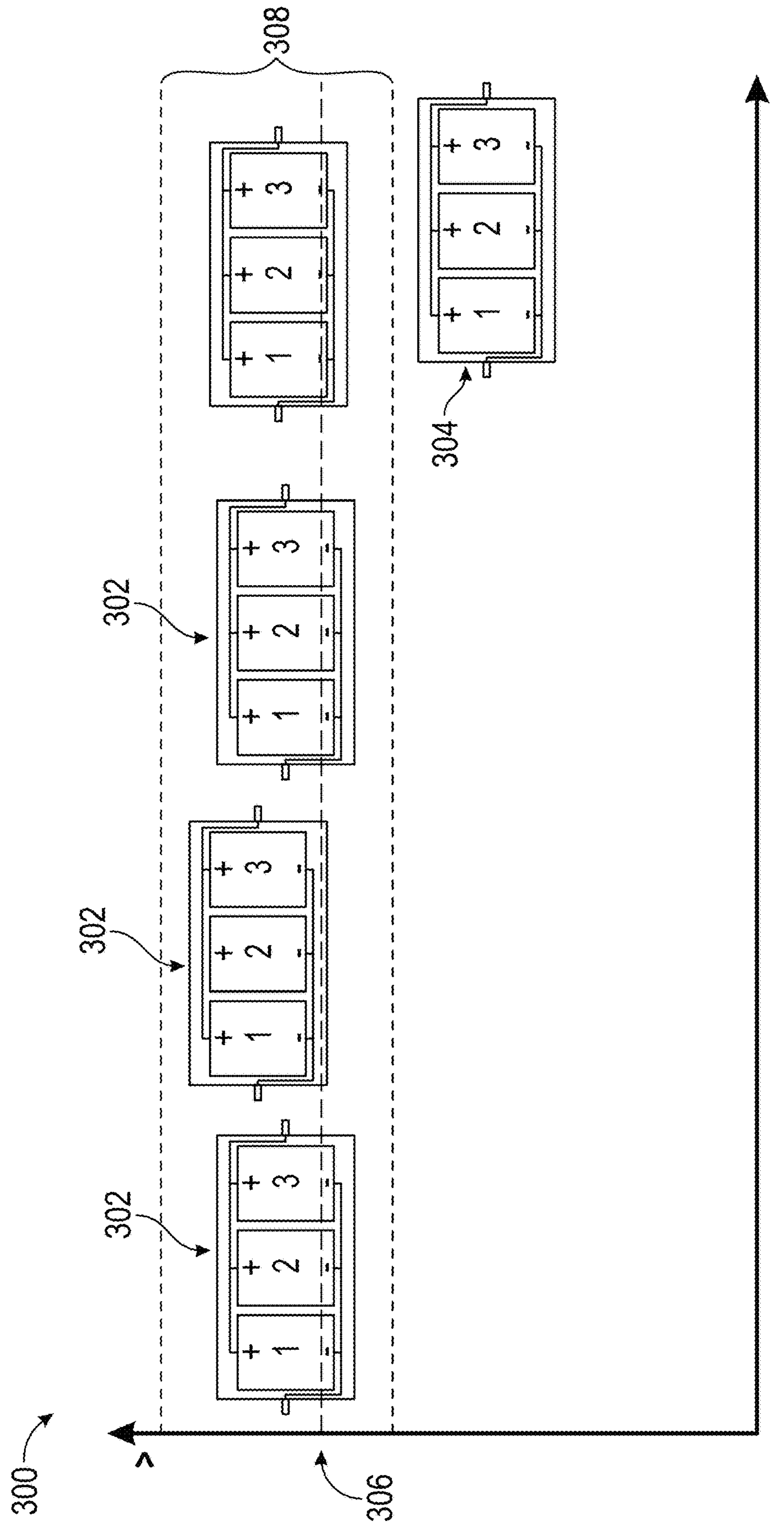
FIG. 3 is a graph illustrating the voltages of multiple cells of a battery pack of a vehicle in accordance with an exemplary embodiment.

Referring now to FIG. 3, a graph 300 illustrating the voltages of multiple lithium-ion battery cells of a battery pack in accordance with an exemplary embodiment is shown. The graph 300 includes an average cell voltage level 306 and a threshold range 308 of expected voltage levels for the cells of the battery pack. A lithium-ion battery cell having a voltage level that is within the threshold range 308 are considered to be normal, or nominal, battery cells 302. Lithium-ion battery cells that have voltage levels below the threshold range 308 are considered to be defective battery cells 304. In one embodiment, the threshold range 308 of expected voltage levels for the cells of the battery pack is determined to be within one standard deviation from the average cell voltage level 306.

In an exemplary embodiment, the voltage level for each lithium-ion battery cell is determined by measuring an open-circuit-voltage (OCV) of the battery cell, or group of battery cells connected in parallel. Once the OCV for a battery cell is obtained, the state-of-charge (SOC) of the battery cell is determined by using a lookup table that correlates the OCV and SOC of the lithium-ion battery cell.

In exemplary embodiments, the self-discharge (SD) of a battery cell is an abstraction that lumps all processes which cause loss of charge through leakage current and the capacity fade (CF) is an abstraction that lumps all processes through which a cell might lose charge storing capacity. For example, lithium plating can be modeled as capacity fade due to lithium depletion. In one embodiment, the state-of-charge (SOC) of a battery cell can be calculated as $$SOC = \frac{Q_A - Q_{SD}}{Q_T - Q_F},$$

wherein $Q_A$ is the total charge added to the battery cell during a charging event, $Q_{SD}$ is the total cell self-discharge, $Q_T$ is the total capacity of the battery cell, and $Q_F$ is the capacity fade of the battery cell.

In a charge event, T1 represents the state before the charge event and T2 represents the state after the charge event. The following set of equations can be used to solve for $Q_{SD}$ and $Q_F$ based on the measured values of the SOC of a defective cell ($SOC_{def}$) and the SOC of a normal cell ($SOC_{nom}$):

$$SOC_{nom,T1} = \frac{Q_A}{Q_T};\ SOC_{def,T1} = \frac{Q_A - Q_{SD}}{Q_T - Q_F}$$

$$SOC_{nom,T2} = \frac{Q_A + \Delta Q_A}{Q_T};\ SOC_{def,T2} = \frac{Q_A - Q_{SD} + \Delta Q_A}{Q_T - Q_F}$$

$$Q_F = Q_T\left(1 - \frac{SOC_{nom,2} - SOC_{nom,1}}{SOC_{def,2} - SOC_{def,1}}\right)$$

$$Q_{SD} = Q_T\left(SOC_{nom,1} - SOC_{def,1} * \frac{SOC_{nom,2} - SOC_{nom,1}}{SOC_{def,2} - SOC_{def,1}}\right).$$

Figure 4B:
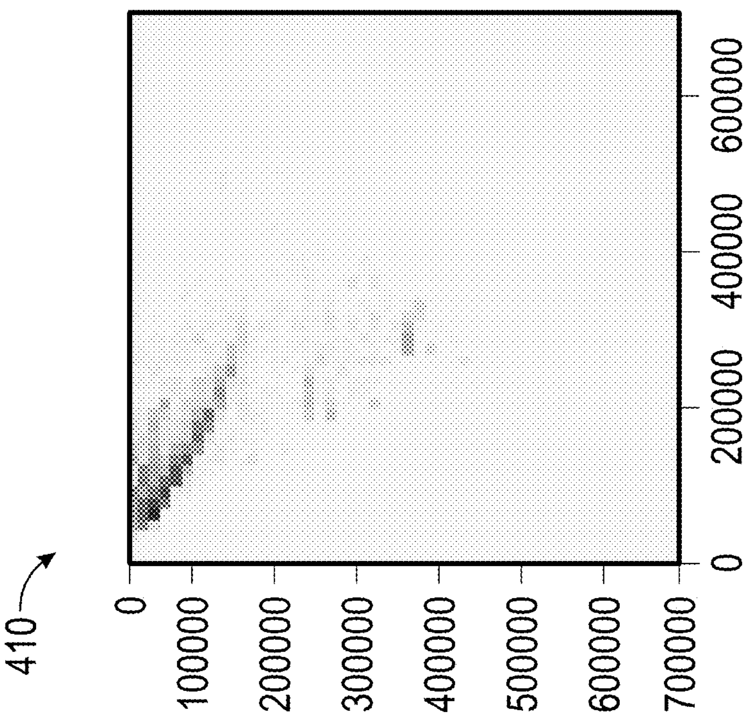
FIGS. 4B, 4C, 4D, and 4E are graphs illustrating a self-discharge and capacity fade of defective battery cells having a known root cause in accordance with an exemplary embodiment.
Figure 4A:
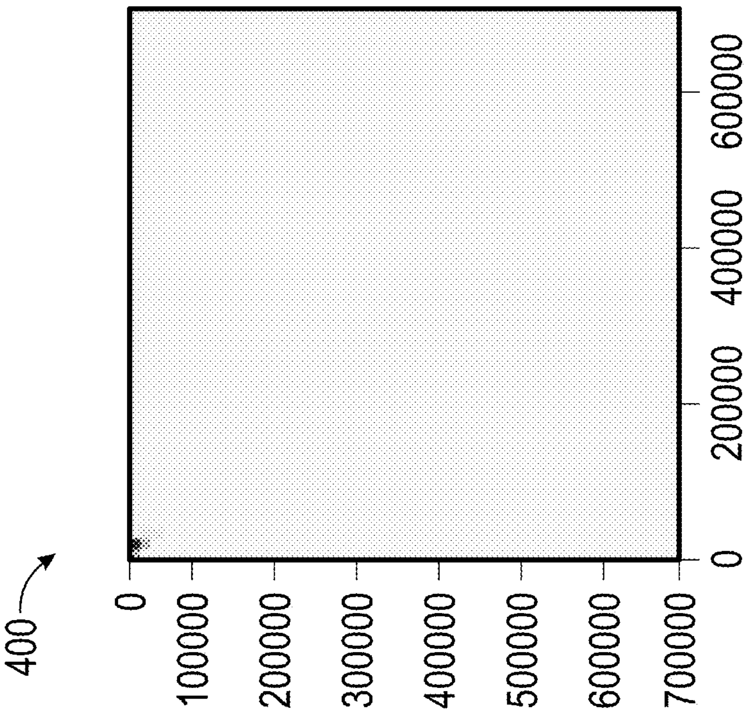
FIG. 4A is a graph illustrating a self-discharge and capacity fade of a healthy battery cell of a battery pack of a vehicle in accordance with an exemplary embodiment.

Referring now to FIG. 4A, a graph 400 illustrating a self-discharge and capacity fade of a healthy lithium-ion battery cell of a battery pack of a vehicle in accordance with an exemplary embodiment is shown. As illustrated, in a healthy lithium-ion battery cell the self-discharge of the lithium-ion battery cell as a function of the capacity fade of the lithium-ion battery cell is relatively constant. By contrast, graphs 410, 420, 430, and 440 shown in FIGS. 4B, 4C, 4D, and 4E illustrate the relationship between the self-discharge and capacity fade of defective lithium-ion battery cells.

Figure 4C:
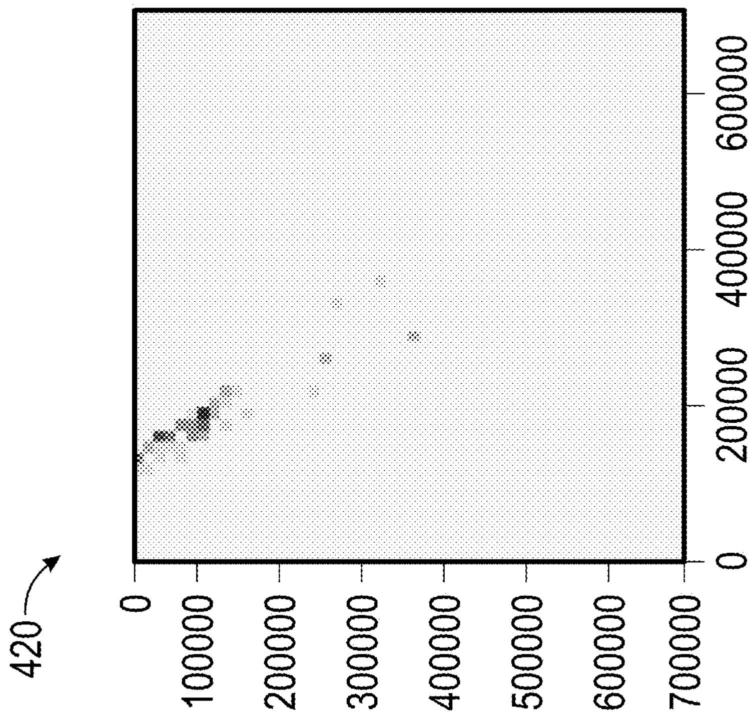
Figure 4D:
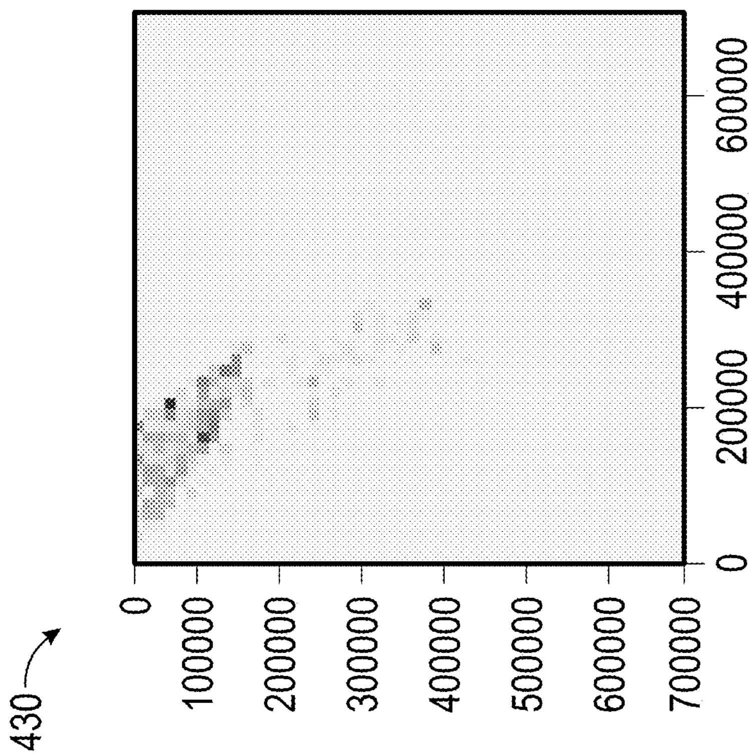
Figure 4E:
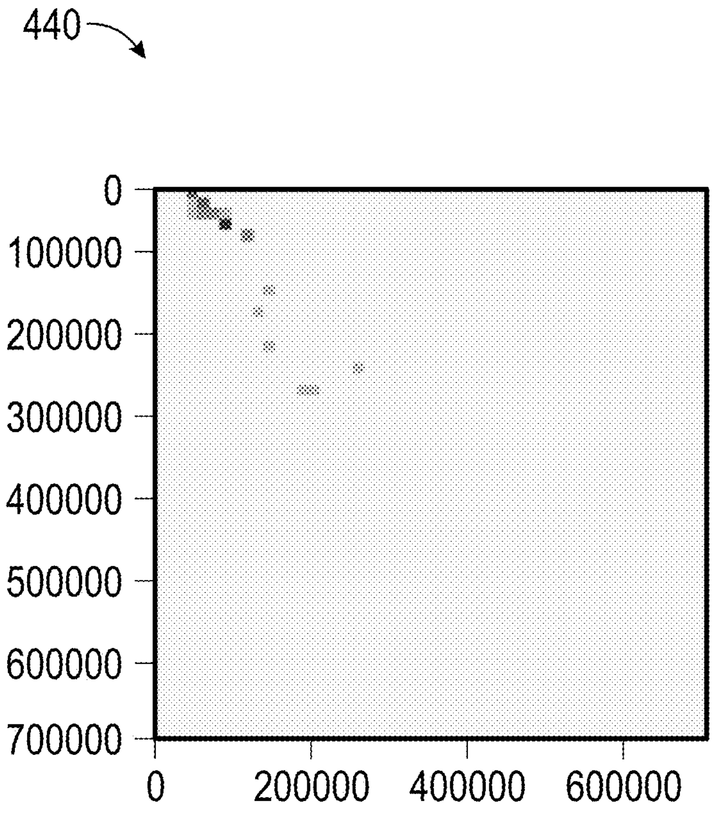

FIG. 4B is a graph 410 illustrating the relationship between the self-discharge and the capacity fade of a defective lithium-ion battery cell having a known error of a punctured separator. As shown in graph 410, as the capacity fade of the defective lithium-ion battery cell increased, the self-discharge of the defective lithium-ion battery cell also increases in an approximately linear fashion. FIG. 4C is a graph 420 illustrating the relationship between the self-discharge and the capacity fade of a defective lithium-ion battery cell having a known error of a folded cathode tab. FIG. 4D is a graph 430 illustrating the relationship between the self-discharge and the capacity fade of a defective lithium-ion battery cell having a known error of a folded separator. FIG. 4E is a graph 440 illustrating the relationship between the self-discharge and the capacity fade of a defective lithium-ion battery cell having a known error of a lamination separator short.

In exemplary embodiments, manufacturers of lithium-ion battery cells collect capacity fade and self-discharge data for defective lithium-ion battery cells and inspect the defective lithium-ion battery cells to determine the root cause of their defect. The collected capacity fade and self-discharge data is then labeled with the identified root cause and the graphs 410, 420, 430, and 440 shown in FIGS. 4B, 4C, 4D, and 4E are created using the collected and labeled data. In exemplary embodiments, the collected capacity fade and self-discharge data for defective lithium-ion battery cells includes several data points measured before/after charging events for each defective lithium-ion battery cell.

Figure 5:
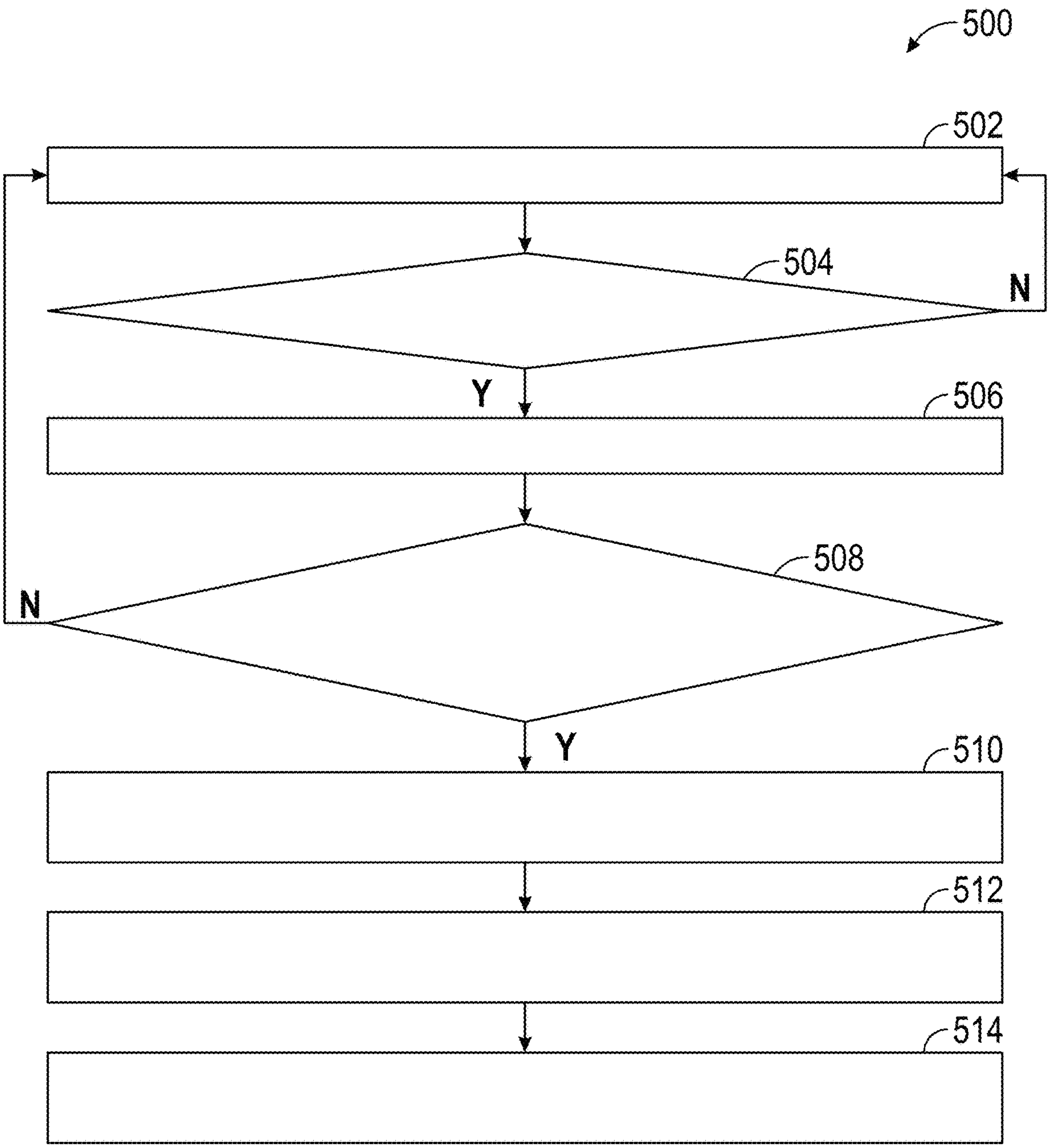
FIG. 5 is a flowchart illustrating a method for identifying a defective battery cell in a battery pack and determining a root cause associated with the defective battery cell in accordance with an exemplary embodiment.

Referring now to FIG. 5, a flowchart illustrating a method 500 for identifying a defective battery cell in a battery pack and determining a root cause associated with the defective battery cell in accordance with an exemplary embodiment is shown. At block 502, the method 500 includes collecting voltage data for lithium-ion battery cells in a battery pack and calculating statistics for the collected voltage data. The statistics include a mean voltage level, a minimum cell voltage level, and a standard deviation of the voltage level of the battery cells. Next, at decision block 504, the method 500 determines whether the battery pack has experienced a charging event. If the battery pack has experienced a charging event, the method 500 proceeds to block 506 and identifies voltage levels for each battery cell from before and after the charging event.

Next, at decision block 508, the method 500 determines whether the voltage level from after the charging event is greater than the voltage level from before the charging event by at least a threshold amount, (i.e., was at least a minimum amount of charge added to the battery cells). If so, the method 500 proceeds to block 510 and identifies a defective cell and a nominal cell based on the voltage level of the cells and calculates the self-discharge and capacity fade of the defective cell. In exemplary embodiments, more than one defective cell in the battery pack can be identified. In one embodiment, any cell having a voltage that is less than the average voltage by at least a threshold amount is determined to be a defective cell. In another embodiment, any cell having a voltage that is more than one or more standard deviation below the average voltage is determined to be a defective cell.

Next, at block 512, the method 500 includes analyzing the self-discharge and capacity fade of the defective cell to determine a root cause of the defect of the defective battery cell. In one embodiment, the analysis includes using a trained machine learning model to identify the root cause of the defect of the defective battery cell. In another embodiment, the analysis includes using one or more distance metrics to compare the calculated self-discharge and capacity fade of the defective cell to self-discharge and capacity fade data of defective cells with known root causes. In exemplary embodiments, the analysis generates a root cause for the defective battery cell and a confidence score associated with the root cause. The method 500 concludes at block 514 by providing the root cause information to the battery manufacturer for design feedback and improvement.

Figure 6:
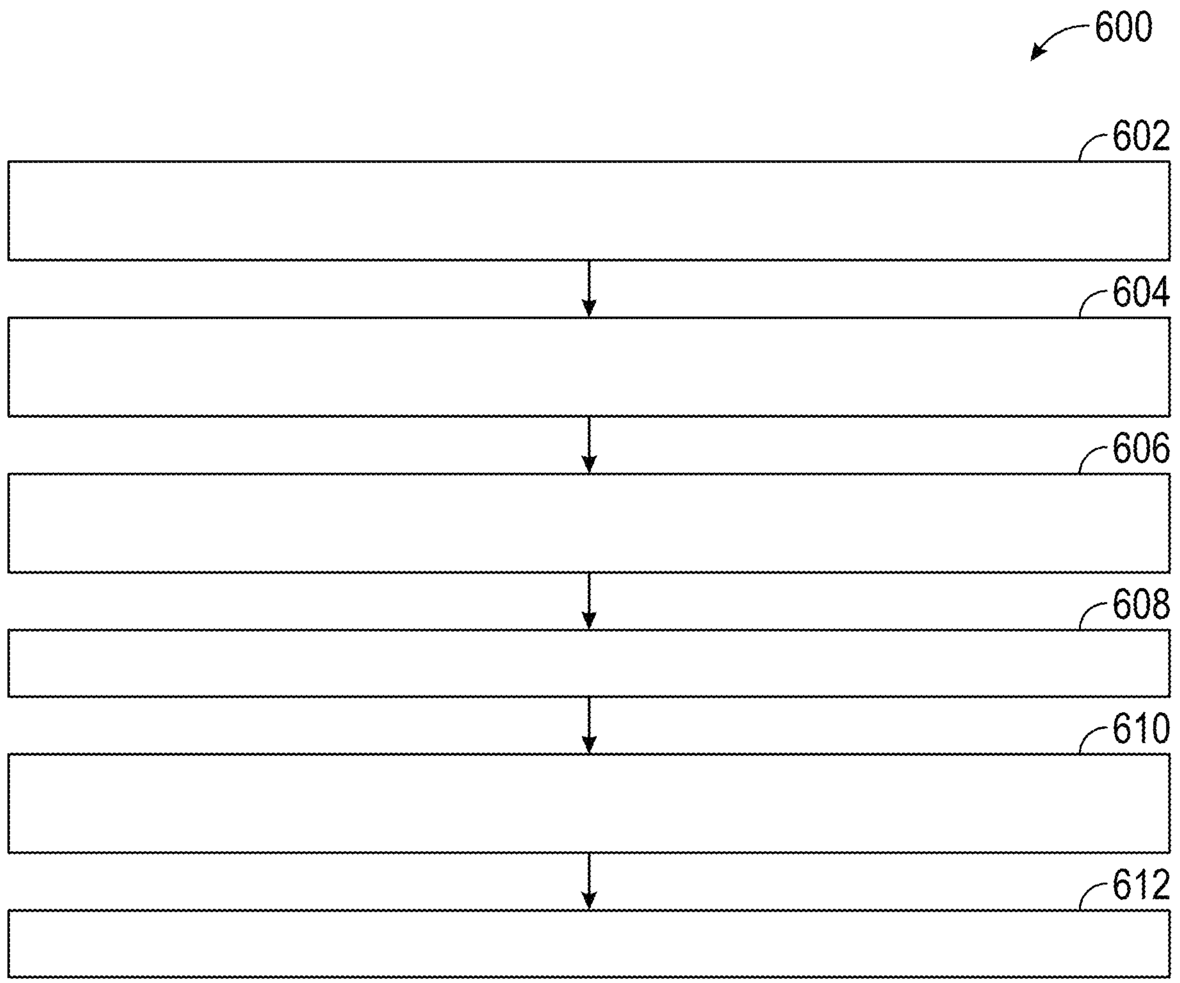
FIG. 6 is a flowchart illustrating a method for training a machine learning model to identify the root causes of defective battery cells in accordance with an exemplary embodiment.

Referring now to FIG. 6, a flowchart illustrating a method 600 for training a machine learning model to identify root causes of defective battery cells in accordance with an exemplary embodiment is shown. At block 602, the method 600 includes obtaining historical collected voltage data for defective battery cells having known root causes of failure. Next, as shown at block 604, the method 600 includes identifying before and after charge event voltage level pairs from the data set. At block 606, the method 600 includes cleaning the data set to remove data that corresponds to charge events that did not result in at least a minimum amount of charge being added to the battery cell. Next, at block 608 the self-discharge and capacity fade for each charging event are calculated. The method 600 also includes creating histograms for each known root cause based on the calculated self-discharge and capacity fade for each charging event that correspond to each known root cause at block 610. The method 600 concludes at block 612 by training a machine learning prediction model using the histograms that have been labeled with the known root cause.

Figure 7:
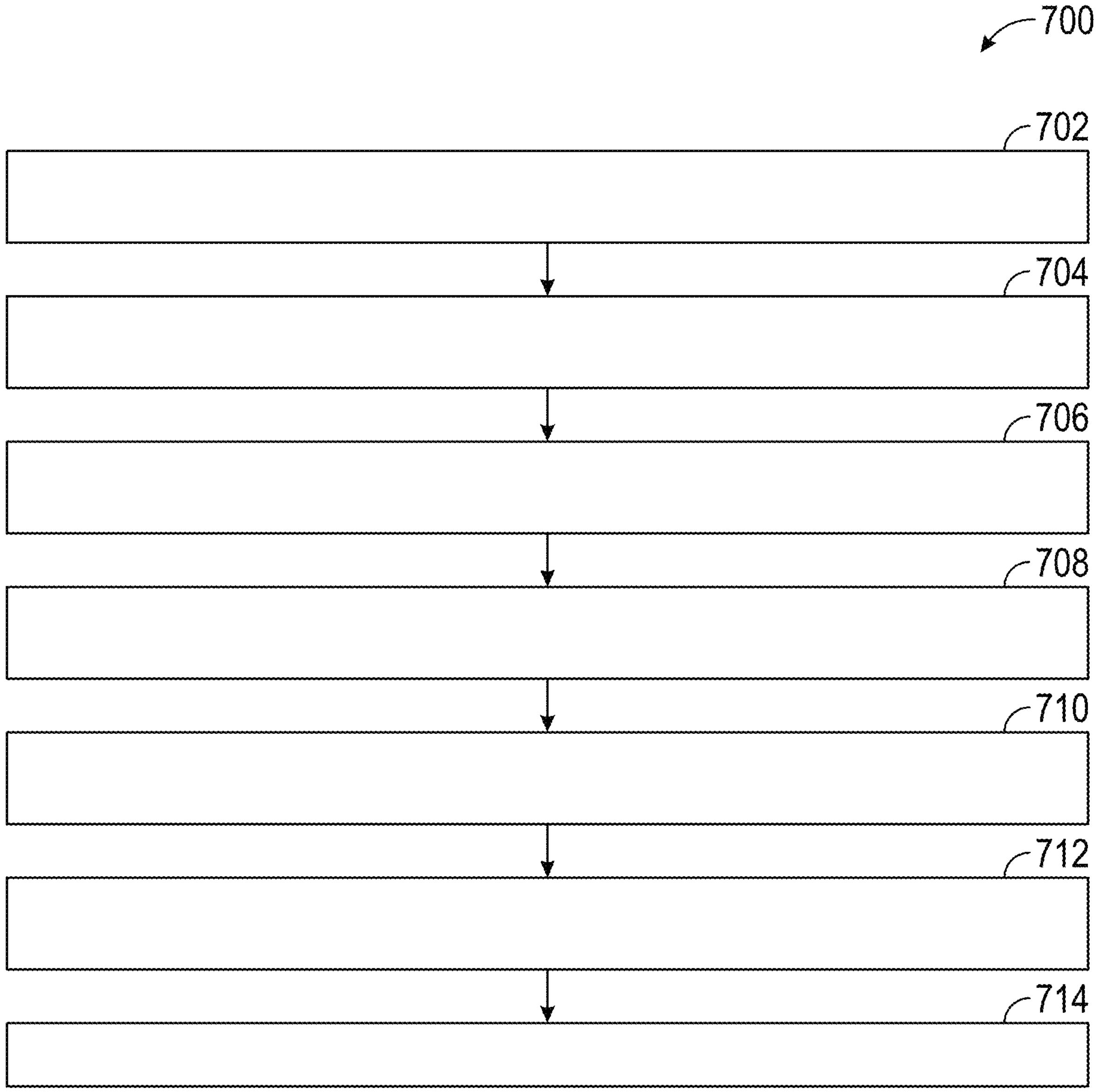
FIG. 7 is a flowchart illustrating a method for identifying the root cause of battery cell degradation in a battery pack in accordance with an exemplary embodiment.

Referring now to FIG. 7, a flowchart illustrating a method 700 for identifying a root cause of battery cell degradation in a battery pack in accordance with an exemplary embodiment is shown. At block 702, the method 700 includes collecting voltage data for each of a plurality of battery cells in the battery pack. In one embodiment, the open-circuit-voltage for each of the battery cells in the battery pack is obtained via a plurality of sensors. In exemplary embodiments, the voltage data is collected before and after each charging event of the battery pack. Next, at block 704, the method 700 includes identifying a first cell of the plurality of battery cells as a defective battery cell. In exemplary embodiments, the identification of the first cell as a defective battery cell is based on a determination that the voltage of the first cell is more than a threshold value below the average voltage of the plurality of battery cells.

At block 706, the method 700 includes identifying a second cell of the plurality of battery cells as a nominal battery cell. In an exemplary embodiment, the identification of the second cell as the nominal battery cell is based on a determination that a voltage of the second cell is within a threshold value of an average voltage of the plurality of battery cells. Next, at block 708, the method 700 includes calculating a self-discharge of the defective battery cell based on the voltage data of the defective battery cell and the nominal battery cell. At block 710, the method 700 also includes calculating a capacity fade of the defective battery cell based on the voltage data of the defective battery cell and the nominal battery cell. In exemplary embodiments, the self-discharge and capacity fade of the defective battery cell are calculated based on the SOC of the defective battery cell and the SOC of the nominal battery cell from before and after a charging event.

At block 712, the method 700 includes determining the root cause of a defect of the defective battery cell based on the self-discharge and the capacity fade of the defective cell. In one embodiment, determination of the root cause includes creating a histogram of a relationship between the self-discharge of the defective battery cell and the capacity fade of the defective battery cell. In exemplary embodiments, the determination of the root cause also includes inputting the histogram into a trained predictive model, which is a machine learning model that is trained with labeled battery cell failure data.

In exemplary embodiments, the determination of the root cause includes comparing the histogram to a plurality of histograms associated with known root causes of battery cell degradation. In one embodiment, the comparison includes using one or more distance metrics to compare the created histogram with histograms associated with known root causes.

At block 714, the method 700 includes performing an action based on the determined root cause. In one embodiment, the action includes sending an indication of the defective battery cell and the root cause to a manufacturer of the battery pack. In exemplary embodiments, the manufacturer utilizes the received data to update the design of the battery cells and or battery pack. In addition, the manufacturer can utilize the received data to update the trained machine learning models. In another embodiment, the action includes deactivating the defective battery cell in the battery pack based on the root cause of the degradation. For example, in one embodiment, if the root cause of the degradation is determined to be a lamination separator short, the battery cell, or group of battery cells containing the defective battery cell, is deactivated.

Although it is primarily discussed above that the nominal battery cell is a cell of the battery pack that contains the defective cell, in some embodiments the nominal battery cell may be separate from the battery pack that includes the defective battery cell. For example, the nominal battery cell may be a battery cell of a different battery pack in the same vehicle or another vehicle. In exemplary embodiments, the battery cell selected as the nominal battery cell has experiences similar aging, operating, and charging conditions as the defective cell.

The terms "a" and "an" do not denote a limitation of quantity, but rather denote the presence of at least one of the referenced item. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A method for identifying a root cause of battery cell degradation in a battery pack, the method comprising:

collecting voltage data for a plurality of battery cells in the battery pack before and after each charging event of the battery pack;

identifying a first cell of the plurality of battery cells as a defective battery cell based on a determination that a voltage of the first cell is more than a threshold value below an average voltage of the plurality of battery cells;

identifying a second cell of the plurality of battery cells as a nominal battery cell based on a determination that a voltage of the second cell is within a threshold value of an average voltage of the plurality of battery cells;

calculating a self-discharge of the defective battery cell based on the voltage data of the defective battery cell and the nominal battery cell, wherein the self-discharge is calculated based on a state-of-charge (SOC) of the defective battery cell and the SOC of the nominal battery cell from before and after a charging event;

calculating a capacity fade of the defective battery cell based on the voltage data of the defective battery cell and the nominal battery cell, wherein the capacity fade is a loss of a charge storing capacity of the defective battery cell that is calculated based on the SOC of the defective battery cell and the SOC of the nominal battery cell from before and after a charging event;

determining the root cause of a defect of the defective battery cell based on the self-discharge and the capacity fade of the defective battery cell; and deactivating the defective battery cell in the battery pack based on the root cause of the battery cell degradation.

2. The method of claim 1, wherein the determination of the root cause comprises creating a histogram of a relationship between the self-discharge of the defective battery cell and the capacity fade of the defective battery cell.

3. The method of claim 2, wherein the determination of the root cause further comprises inputting the histogram into a trained predictive model.

4. The method of claim 3, wherein the trained predictive model is a machine learning model that is trained with labeled battery cell failure data.

5. The method of claim 2, wherein the determination of the root cause comprises comparing the histogram to a plurality of histograms associated with known root causes of battery cell degradation.

6. The method of claim 1, further comprising providing an indication of the defective battery cell and the root cause to a manufacturer of the battery pack.

7. The method of claim 1, wherein the plurality of battery cells are arranged in a plurality of groups each comprising three of the plurality of battery cells connected in parallel and wherein each of the plurality of groups are connected in series.

8. The method of claim 1, wherein the voltage data comprises open-circuit-voltage (OCV) data for each of the plurality of battery cells, the open-circuit-voltage (OCV) data being obtained via a plurality of sensors.

9. The method of claim 8, further comprising determining a state-of-charge (SOC) of each of the plurality of battery cells by using a lookup table that correlates the OCV and SOC of the lithium-ion battery cell.

10. The method of claim 1, wherein calculating the self-discharge of the defective battery cell and calculating the capacity fade of the defective battery cell are performed only when a voltage level from after the charging event is greater than a voltage level from before the charging event by at least a threshold amount.

11. The method of claim 1, wherein determining the root cause comprises creating a histogram of a relationship between the self-discharge of the defective battery cell and the capacity fade of the defective battery cell, and using one or more distance metrics to compare the created histogram with histograms associated with known root causes of battery cell degradation.

12. An electric vehicle comprising:

a battery pack having a plurality of lithium-ion battery cells; and a controller configured to monitor a voltage level of each of the plurality of lithium-ion battery cells, wherein the controller is further configured to:

collect voltage data for each of a plurality of battery cells in the battery pack before and after each charging event of the battery pack;

identify a first cell of the plurality of battery cells as a defective battery cell based on a determination that a voltage of the first cell is more than a threshold value below an average voltage of the plurality of battery cells;

identify a second cell of the plurality of battery cells as a nominal battery cell based on a determination that a voltage of the second cell is within a threshold value of an average voltage of the plurality of battery cells;

calculate a self-discharge of the defective battery cell based on the voltage data of the defective battery cell and the nominal battery cell, wherein the self-discharge is calculated based on a state-of-charge (SOC) of the defective battery cell and the SOC of the nominal battery cell from before and after a charging event;

calculate a capacity fade of the defective battery cell based on the voltage data of the defective battery cell and the nominal battery cell, wherein the capacity fade is a loss of a charge storing capacity of the defective battery cell that is calculated based on the SOC of the defective battery cell and the SOC of the nominal battery cell from before and after a charging event;

determine a root cause of a defect of the defective battery cell based on the self-discharge and the capacity fade of the defective battery cell; and deactivate the defective battery cell in the battery pack based on the root cause of the battery cell degradation.

13. The electric vehicle of claim 12, wherein determination of the root cause comprises creating a histogram of a relationship between the self-discharge of the defective battery cell and the capacity fade of the defective battery cell.

14. The electric vehicle of claim 13, wherein the determination of the root cause further comprises inputting the histogram into a trained predictive model.

15. The electric vehicle of claim 14, wherein the trained predictive model is a machine learning model that is trained with labeled battery cell failure data.

16. The electric vehicle of claim 13, wherein the determination of the root cause comprises comparing the histogram to a plurality of histograms associated with known root causes of battery cell degradation.

17. The electric vehicle of claim 12, wherein the controller is further configured to provide an indication of the defective battery cell and the root cause to a manufacturer of the battery pack.

18. The electric vehicle of claim 12, wherein the plurality of battery cells are arranged in a plurality of groups each comprising three of the plurality of battery cells connected in parallel and wherein each of the plurality of groups are connected in series.

19. The electric vehicle of claim 12, wherein the controller is further configured to determine a state-of-charge (SOC) of each of the plurality of battery cells by using a lookup table that correlates open-circuit-voltage (OCV) and SOC of the lithium-ion battery cell.

20. The electric vehicle of claim 12, wherein determining the root cause comprises creating a histogram of a relationship between the self-discharge of the defective battery cell and the capacity fade of the defective battery cell, and using one or more distance metrics to compare the created histogram with histograms associated with known root causes of battery cell degradation.

* * * * *